United States Patent [19]

Olver

[11] Patent Number: 4,926,136

[45] Date of Patent: May 15, 1990

[54] POWER AMPLIFIER COMBINER FOR IMPROVING LINEARITY OF AN OUTPUT

[75] Inventor: Terence E. Olver, Catonsville, Md.

[73] Assignee: Westinghouse Electric Corp., Pittsburgh, Pa.

[21] Appl. No.: 291,601

[22] Filed: Dec. 29, 1988

[51] Int. Cl.$^5$ .................................................. H03F 1/26
[52] U.S. Cl. ...................................... 330/149; 330/151; 330/286; 330/295
[58] Field of Search ................... 330/124 R, 149, 151, 330/286, 295, 302

[56] References Cited

U.S. PATENT DOCUMENTS

| 4,130,807 | 12/1978 | Hall et al. | 330/124 R |
| 4,560,945 | 12/1985 | Olver | 330/151 X |

Primary Examiner—Steven Mottola
Attorney, Agent, or Firm—W. G. Sutcliff

[57] ABSTRACT

A high power amplifier combiner for improving the linearity of an output of an amplifier. At least two prelinearizers are used to suppress all distortion products by using feedforward cancelling techniques. The effects of compression associated with the operation of the high power amplifier are reduced.

8 Claims, 2 Drawing Sheets

POWER AMPLIFIER COMBINER FOR IMPROVING LINEARITY OF AN OUTPUT

BACKGROUND OF THE INVENTION (1) Field of the Invention

The present invention is directed to reducing distortion products in the combined outputs of power amplifiers. All the even and many odd order distortion products are suppressed by employing a four phase amplifier. In addition, the distortion products are reduced by 6 dB by employing a feedforward canceler.

(2) Description of Related Art

Distortion products are generated in power amplifiers, particularly due to the transfer characteristics of an active amplifying device. The distortion products are present in the output as harmonics and intermodulation products of fundamental signals which are amplified and distort the amplitude envelope of the fundamental signals injected into the input of the amplifiers. In broadband amplifiers, these distortion products cannot be filtered from the output. In prior art devices, only even order harmonics are suppressed in a push-pull amplifier type device. There is no cancellation of odd order distortion products.

The present invention overcomes the failures of the prior art by obtaining output power that is more linear than the output from prior art devices.

SUMMARY OF THE INVENTION

An object of the present invention is to provide an output of a power amplifier which is more linear than outputs from prior art amplifiers by reducing the distortion products generated internally by the amplifier.

Another object of the present invention is to provide a device for combining the outputs of a plurality of power amplifiers into a single output.

Yet another object of the present invention is to provide a high-linearity amplifier operating over a wide bandwidth employing amplitude modulation such that the amplitude envelope of fundamental signals injected into an input is less distorted than outputs from prior art amplifiers.

The present invention achieves the above objects by providing a four phase amplifier to suppress all even and many odd order distortion products (i.e., harmonics and intermodulation products). This is accomplished by employing a first quadrature hybrid which receives a fundamental input signal and outputs two signals, at least two prelinearizers each respectively receiving the two output signals, and a second quadrature hybrid connected between the two prelinearizers for receiving and combining the two output signals from the two prelinearizers and outputting a signal having low distortion levels. Each of the prelinearizers includes two separate, overlapping, feedforward cancellation loops. The first feedforward cancellation loop includes a first coupler connected to the first quadrature hybrid for dividing the signal from the first quadrature hybrid into two signals, a first amplifier coupled to the first coupler for receiving one of the two signals output from the first coupler, first delay means for receiving a second one of the two signals output from the first coupler, a second coupler coupled to the first amplifier for receiving the signal output from the first amplifier and a third coupler connected between the second coupler and the first delay means. The first coupler can be a 7 dB coupler which divides the input signal into two unequal signals, the second coupler can be an output sample coupler, and the third coupler can be a fundamental cancellation coupler. An attenuator can be connected between the second and third couplers. The second feedforward cancellation loop includes the second coupler, the third coupler, a second amplifier connected to the third coupler for receiving the signal delayed by the first delay means and the signal from the first amplifier, second delay means coupled to the second coupler, and a hybrid circuit connected between the second delay means and the second amplifier for receiving/combining output signals from the first and second amplifiers and outputting a signal to the second quadrature hybrid. The feedforward cancellation loops are provided to improve the linearization of at least two power amplifiers combined together. This is referred to as prelinearization cancellation, and provides a reduction of approximately 6 dB of distortion products.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Ultralinear high power amplifiers are necessary in high frequency anti-jam communication systems. The frequency range of these systems is from 2 to 30 MHz. Power amplifiers, however, are usually a major contributor to distortion in these communication systems and prior art devices have only been able to get rid of the even order harmonics in the output signal by using push-pull amplifiers. Distortion reduction, however, is far from complete because a normal push-pull amplifier decreases the even order distortion products, i.e., harmonics and intermodulation products, but odd order distortion products remain. The present invention is applicable to high linearity amplifiers operating over a wide bandwidth which employ amplitude modulation. The amplifiers are an essential part of high frequency anti-jam communication systems.

The present invention combines two techniques. A four phase amplifier is used to suppress all even order and many odd order distortion products, and feedforward cancellation is used to further improve the linearity. In addition, two groups of power amplifiers can be combined together in order to reduce the distortion products. Employing a feedforward cancellation system is referred to as prelinearization and provides a reduction in distortion products of approximately 6 dB.

Figure 1:
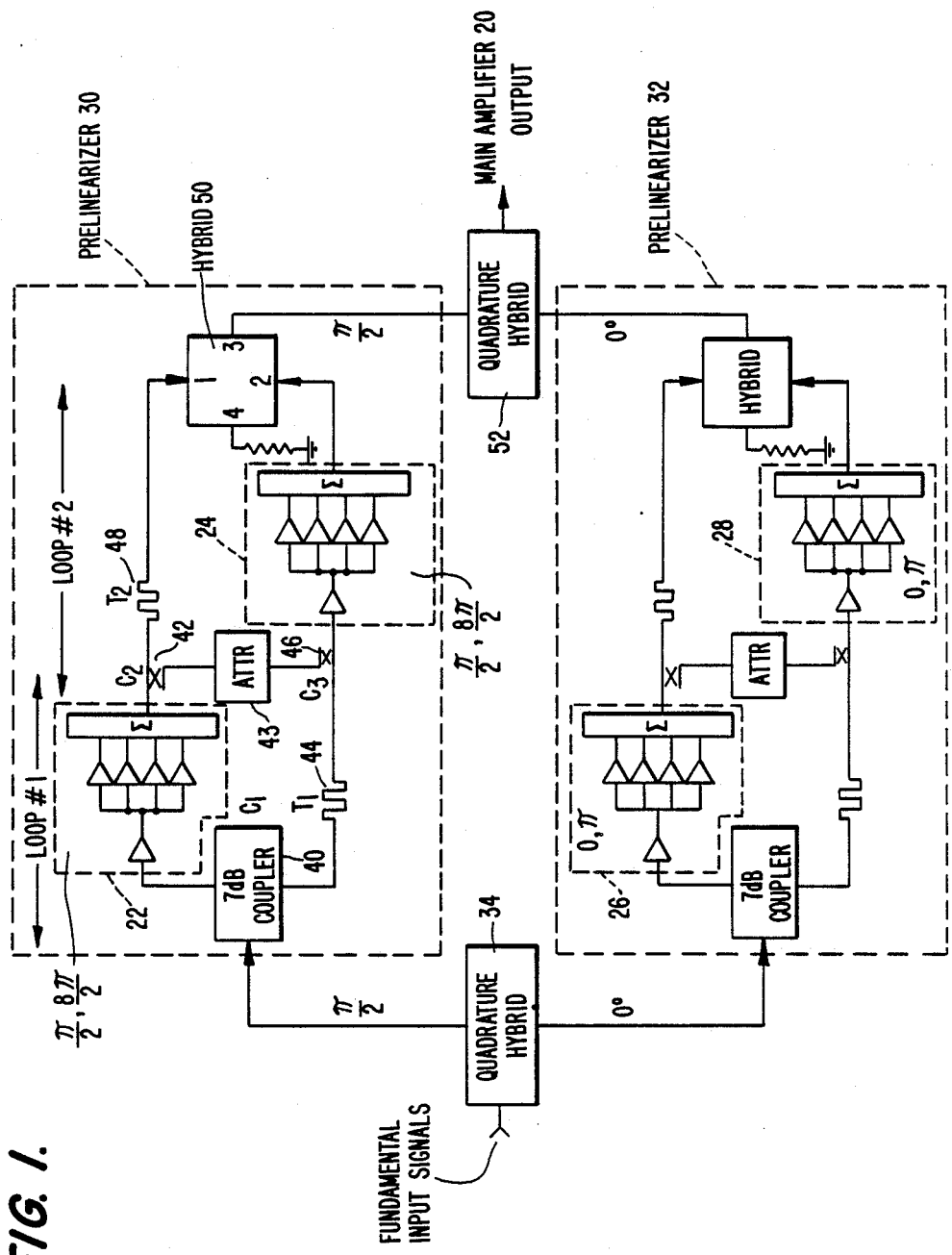
FIG. 1 is a circuit diagram of a combination of amplifiers according to the present invention.

With respect to FIG. 1, a main amplifier 20 includes four identical power amplifiers 22, 24, 26, and 28. These power amplifiers may be conventional individual amplifiers or similar groups of power amplifiers combined together. A group of two of the power amplifiers forms a prelinearizer 30 and 32. Each of the power amplifiers operates in a push-pull manner, thus carrying two phases. Fundamental input signals are input to a quadrature hybrid circuit 34 which divides the input signal into two equal power components having a 90° (or $\pi/2$) phase difference. These two components drive the two identical prelinearizers 30 and 32 which contain the power amplifier pairs 22 and 24, and 26 and 28, respectively. Each of the prelinearizers are identical except for the 90° phase shift differential between input signals. Because of this, only one prelinearizer will be described.

Each prelinearizer 30 and 32 includes two separate but overlapping feedforward cancellation loops. The first loop includes a 7 dB coupler 40, an amplifier 22, an output sample coupler 42, a reference signal delay line 44, and a fundamental cancellation coupler 46. A variable attenuator 43 can be inserted between the output sample coupler 42 and the fundamental cancellation coupler 46. The attenuator 43 is set so that its fundamental signal output cancels the fundamental reference output of the delay line 44 in the fundamental cancelling coupler 46. The 7 dB coupler 40 splits the input signal into two unequal signals. One signal which is one-fifth of the power of the input signal drives the power amplifier 22. The remaining four-fifths of the input signal drives the reference signal delay line 44. The output from the power amplifier 22 is sampled by the output sample coupler 42 and coupled to the fundamental cancellation coupler 46. The output is then subtracted from the output of the reference delay line 44. The delay line 44 matches the time delay of the input signals to the delays accumulated through the path of the amplifier 22, the output sample coupler 42 and the fundamental cancellation coupler 46.

The second loop includes the output sample coupler 42, the fundamental cancellation coupler 46, a power amplifier 24, a second delay line 48, and a hybrid 50. The output of the first loop from the fundamental cancellation coupler 46 drives the power amplifier 24 to an output power equal to that delivered by the power amplifier 22 by way of the second delay line 48 to a first port 1 of the output combiner hybrid 50. The output combiner 50 combines the two signals input to its input ports 1 and 2, and outputs an output signal. The above circuit elements in the first and second loops are conventional elements.

The output sample coupler 42 samples fundamental signals, distortion products and noise generated by the power amplifier 22. The fundamental cancellation coupler 46 reverses the phase of all the signals by 180° so that combining the signals from the power amplifier 22 with the reference signals results in a subtraction of the output sample fundamental component from the reference signal. The reference signal has a voltage twice that of the output sample. After the subtraction operation in the fundamental cancellation coupler 46, the voltage is reduced to equal the voltage used to drive the power amplifier 22 neglecting small losses in the delay line 44. The fundamental signal input to the power amplifier 24 is therefore the same signal as the fundamental signal input to power amplifier 22. In addition, the phase inverted signals of the distortion and noise generated by the power amplifier 22 are present at the input to the power amplifier 24. The signals are amplified by the power amplifier 24 and output to the combiner hybrid 20 at port 2. The amplified fundamental signals from the power amplifier 22 are also coupled to the output combiner hybrid 50 at port 1. The two fundamental input signals at ports 1 and 2 of the output combiner hybrid 50 are equal in power and phase and the combination of these two signals results in the sum of these two signals at the output of the main amplifier 20, without regard to the small losses in the output combiner hybrid 50.

With respect to the distortion and noise components generated by the power amplifier 22, the following occurs. First, the distortion and noise components generated by the power amplifier 22 are input directly to port 1 of the output combiner hybrid 50 by way of the second delay line 48. The second path followed by the distortion and noise components generated by the power amplifier 22 is through the power amplifier 24 to the port 2 of the output combiner hybrid 50. That is, after inversion by phase reversal in the fundamental cancellation loop 46 and amplification of the signals, these signals are equal in power but opposite in phase at the inputs of the output combiner hybrid 50 and cancel in the output of an output quadrature hybrid 52. Therefore, none of the distortion by the power amplifiers 22 and 26, respectively appears in the outputs of the prelinearizers 30 or 32. However, since the factors which generate distortion in the power amplifier 22 also exist in the power amplifier 24, the power amplifier 24 generates its own distortion. The distortion generated in the power amplifier 24 is then injected into port 2 of the output hybrid combiner 50. Since the distortion of the power amplifier 24 is not present at port 1, the output combiner hybrid divides this distortion equally between output port 3 and dummy load port 4. The result is that the output from the prelinearizer 30 or 32 contains only one-half the distortion generated by the power amplifier 24 and none of the distortion generated by the power amplifier 22. That is, the distortion power is only one quarter of the distortion power produced by both amplifiers 22 and 24.

As noted above, this is in contrast to prior art combination methods and devices in which all the distortion power from both amplifiers would be combined in the output signal. The output signal of the present invention is thus, four times (approximately 6 dB), i.e., a 4:1 ratio, better when compared with conventional combination techniques and systems.

The output from each prelinearizer 30 and 32 is then coupled to respective inputs of an output quadrature hybrid 52 which combines the outputs together by eliminating the phase differential between outputs.

In effect, the main amplifier carries four phases (0, $\pi/2$, $\pi$ and $3\pi/2$) separately through the four power amplifiers and combines them at the output. During the recombination process, all even order products are suppressed. Additionally, many odd order products, i.e., third, seventh, eleventh, etc., are also suppressed. The degree of suppression varies over the frequency band. Improvement in a 500 watt amplifier, for example, is approximately 10 to 16 dB suppression of third order products.

Figure 2:
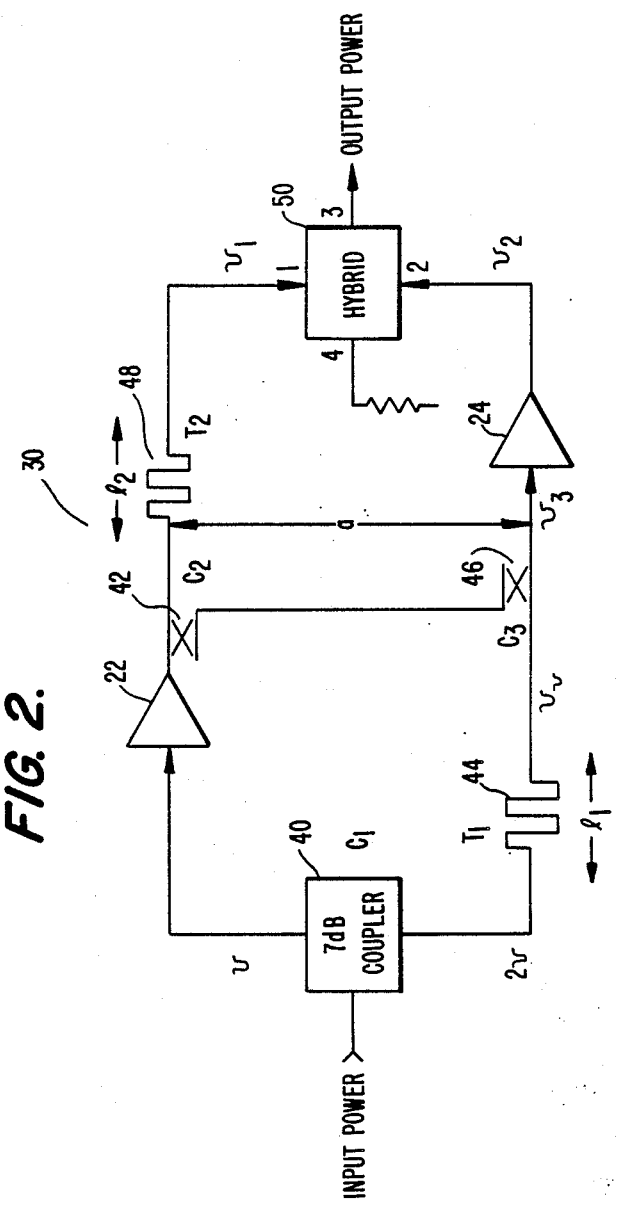
FIG. 2 is a circuit diagram of one of the prelinearizer cancelers shown in FIG. 1.

FIG. 2 is a simplified circuit diagram of one of the prelinearizers 30 or 32 shown in FIG. 1. In FIG. 2, the circuits have been normalized to a 1 ohm impedance and the input power is given as P, where $$P = 5v^2$$

v = rms voltage of the input signal. Thus, the input voltage to power amplifier 22 equals v and the input voltage to the delay line 44 equals 2v. The voltage output from the power amplifier 27 equals $v \cdot \sqrt{g}$ where g = power gain. The power gains of power amplifiers 22 and 24 are equal. A voltage $v_1$ is output to port 1 of the output combiner hybrid 50 and is given by $$v_1 = v \cdot \frac{g}{\sqrt{L_2}}$$

where $L_2$=loss of delay line 48.

The voltage v which is coupled to the output of the fundamental cancellation coupler 46 from the power amplifier 22 is therefore $$v_a = -v \cdot \frac{g}{\sqrt{a}}$$

where a=attenuation between the output of the power amplifier 22 and the output from the fundamental cancellation coupler 46. The voltage $v_r$ coupled directly to the fundamental cancellation coupler 46 by way of the reference signal delay line 44 is given by $$v_r = \frac{2v}{\sqrt{L_1}}$$

where $L_1$=loss of the delay line 44. The output from the fundamental cancellation coupler 46 is equal to $v_3$ which is equal to $v_r + v_a$.

$$v_3 = \frac{2v}{\sqrt{L_1}} - v\frac{g}{\sqrt{a}}$$

The voltage output from the power amplifier 24 and coupled to port 2 of the output combiner hybrid 50 is given by $$v_2 = \sqrt{g \cdot v_3}$$

The power inputs to ports 1 and 2 are equal so that in corresponding voltages $v_1 = v_2$. Therefore, substituting as follows $$v \cdot \frac{g}{\sqrt{L_2}} = \sqrt{g} \cdot \left[ \frac{2v}{\sqrt{L_1}} - v\sqrt{\frac{g}{a}} \right]$$

which is equal to $\frac{1}{\sqrt{L_2}} = \frac{2}{\sqrt{L_1}} - \frac{g}{\sqrt{a}}$ or $$\sqrt{\frac{g}{a}} = \frac{2}{\sqrt{L_1}} - \frac{1}{\sqrt{L_2}}$$

With the delay lines 44 and 48 having equal losses, then $L_1 = L_2 = L$ and therefore $$\sqrt{\frac{g}{a}} = \frac{1}{\sqrt{L_2}}$$

or $$a = g \cdot L$$

Therefore, for equal power inputs to each half of the output combiner hybrid 50, the attenuation of the output from the power amplifier 22 to the reference line must be equal to the gain of the power amplifier 22 reduced by the loss of the reference signal delay line 44. This is easily achieved in practice. The loss of the reference signal delay line 44 is small when matching this loss differentially across the frequency band to the frequency response of the output sample coupler 42 and fundamental canceler coupler 46 which is relatively easy. In addition, the gain g of the power amplifiers 22 and 24 can be kept substantially constant ($<\pm\frac{1}{4}$ dB variation) across the frequency band of 2-30 MHz.

The overall gain of the prelinearizer 30 or 32 is readily calculated with respect to the output power $P_o$ which equals 2 $gv^2$. The input power is equal to $5v^2$. Thus, the overall gain $g_o$ is equal to $$g_o = 2/5g.$$

Another advantage of the present invention along with improved linearity of the output characteristics, is that of improved compression. Linear amplifiers exhibit a linear relationship between input drive and output power. This is the power gain. Practical amplifiers, however, diverge from a linear output when the power amplifier is driven with high output power. When this occurs the power output increases at a rate less than a linear rate, the gain falls off until saturation occurs, and no increase in output power results from any further increase in drive. Power amplifiers designed for high linearity applications with additional feedforward cancellation linearization operate far from the saturation region, and at the most, operate in a region of mild non-linearity with less than 1 dB compression.

The effects of compression result in the generation of distortion products, i.e., harmonic and intermodulation products, with a fundamental signal output for a given input smaller than an amplifier having a true linear operation. The fundamental signal output can be considered to be that of a linear amplifier, but having a component acting in opposition to the amplitude of the linear fundamental signal and being subtracted from the linear fundamental signal. This compression-generated opposing fundamental signal component increases with an increase in compression and proportionally reduces the fundamental signal. In prelinearizers, the compression generated opposing the fundamental signal component behaves like a distortion product and after being inverted by the first feedforward cancellation loop drives the power amplifier 24 to a higher fundamental output power. One-half of this increase in power appears in the final output of the amplifier. Therefore, by increasing the fundamental output the effects of compression are reduced. An estimate of this reduction is difficult since the increase in drive to the power amplifier 24 does not produce a linear increase in its output because the power amplifier 24 is operating in a mild compression state.

Test work was conducted using two ENI (Electronic Navigation Industries, Inc., Rochester, N.Y.) amplifiers type 504 as the power amplifiers 22 and 24. The test results are compared with calculated minimum compressions obtained based on the power amplifier 24 operating linearly.

| Compression of Amplifier 22 | Measured Compression of Output Amplifier At Port 3 of the Combiner Hybrid 50 | Calculated Compression dB |
|---|---|---|
| 0.70 | 0.37 | 0.37 |
| 1.00 | 0.60 | 0.54 |

From the above, it can be seen that a significant improvement was obtained in that a 1.00 dB compression of the power amplifier 22 was reduced to 0.6 dB at the output. This is close to the theoretical reduction having a minimum of 0.54 dB compression. For 0.70 dB compression the measured compression of the resulting output was 0.37 dB, an improvement of 0.33 dB which is the same as the theoretical compression. This reduction in compression is important to the operation of a highly linear amplifier incorporating feedforward cancellation techniques. This is because the compression effects tend to unbalance the fundamental cancellation loops and necessitate the use of large distortion cancellation amplifiers, thus reducing overall efficiency of the device.

Although the particular arrangement of phase inversion of the distortion products is described, other arrangements using the phase inversion properties of couplers and amplifiers can be used equivalently to obtain the same results. That is, the phase arrangements can be changed in accordance with desired operating characteristics.

The many features and advantages of the invention are apparent from the detailed specification and, thus, it is intended by the appended claims to cover all such features and advantages that fall within the true spirit and scope of the invention. Further, since numerous modifications and changes will readily occur to those skilled in the art, it is not desired to limit the invention to the exact construction and operation shown and described, and accordingly, all suitable modifications and equivalents may be resorted to falling within the scope of the invention.

What is claimed is:

1. A power amplifier combiner for improving linearity, comprising:
    first quadrature hybrid means for receiving fundamental input signals and outputting first and second signals;
    first and second prelinearizer means, coupled to said first quadrature hybrid means, for respectively receiving said first and second output signals and outputting respective output signals, said first and second prelinearizer means including first and second separate, overlapping, feedforward cancellation loops, said first feedforward cancellation loop including:
    a first coupler, connected to said first quadrature hybrid means, for receiving the first output signal and for dividing the signal into third and fourth signals;
    a first amplifier, coupled to said first coupler, for receiving said third signal output from said first coupler and outputting an amplified fifth signal;
    first delay means, connected to said first coupler, for receiving and delaying said fourth signal from said first coupler;
    a second coupler, coupled to said first amplifier, for receiving said fifth signal output from said first amplifier; and
    a third coupler, connected between said second coupler and said first delay means, for receiving said fifth signal and outputting a sixth signal; and
    second quadrature hybrid means, coupled between said first and second prelinearizer means, for receiving and combining said respective output signals from said first and second prelinearizer means and outputting an output signal.

2. A power amplifier combiner according to claim 1, wherein said second feedforward cancellation loop includes:
    said second coupler;
    said third coupler;
    a second amplifier, coupled to said third coupler, for receiving said fourth signal delayed by said first delay means and said sixth signal from said third coupler and outputting a seventh signal;
    second delay means, coupled to said second coupler, for receiving and delaying said fifth signal and outputting an eighth signal; and
    a hybrid circuit, connected between said second delay means and said second amplifier, for receiving and combining said seventh and eighth signals and outputting a ninth signal to said second quadrature hybrid means.

3. A power amplifier combiner according to claim 2, wherein said first coupler comprises a 7 dB coupler which divides the input signal into two unequal signals, wherein said second coupler comprises an output sample coupler, and wherein said third coupler comprises a fundamental cancellation coupler.

4. A power amplifier combiner according to claim 3, further comprising an attenuator connected between said second and third couplers.

5. A power amplifier combiner for improving linearity, comprising:
    first quadrature hybrid means for receiving fundamental input signals and outputting first and second signals;
    first and second prelinearizer means, coupled to said first quadrature hybrid means, for respectively receiving said first and second output signals and outputting respective output signals, each of said first and second prelinearizer means including:
    a first coupler, coupled to receive the first input signal, for dividing the first input signal into third and fourth signals and for outputting the third and fourth signals;
    first delay means, connected to said first coupler, for receiving and delaying the third signal output from said first coupler and outputting a fifth signal;
    a first amplifier, coupled to said first coupler, for receiving and amplifying the fourth signal output from said first coupler;
    a second coupler coupled to said first amplifier;
    second delay means, coupled to said first amplifier, for receiving and delaying the fourth signal and outputting a sixth signal;
    a third coupler coupled to said second coupler;
    an attenuator coupled between said second and third couplers;
    a second amplifier, connected to said first delay means and said third coupler, for receiving and amplifying said fourth and fifth signals and outputting a seventh signal; and a hybrid circuit connected between said second delay means and said second amplifier, for receiving and combining said sixth and seventh signals and outputting an eighth signal; and second quadrature hybrid means, coupled between said first and second prelinearizer means and to said hybrid circuit, for receiving and combining said respective output signals from said first and second prelinearizer means and outputting an output signal.

6. A power amplifier combiner according to claim 5, wherein said first coupler comprises a 7 dB coupler for receiving the fundamental input signal and dividing the fundamental input signal into two unequal signals, said second coupler comprises an output sample coupler, and said third coupler comprises a fundamental cancellation coupler.

7. A power amplifier combiner for improving linearity, comprising:

first quadrature hybrid means for receiving fundamental input signals and outputting first and second signals;

first and second prelinearizer means, coupled to said quadrature hybrid means, for respectively receiving said first and second output signals from said first quadrature hybrid means, each of said first and second prelinearizer means outputting third and fourth signals, and each of said first and second prelinearizer means comprising:

first and second feedforward cancellation loops which overlap, said first feedforward cancellation loop comprising:

a first coupler, coupled to said first quadrature hybrid means, for receiving the first output signal and dividing said first output signal into third and fourth unequal signals;

a first amplifier, coupled to said first coupler, for receiving said third signal from said first coupler and outputting a fifth signal;

a second coupler, coupled to said first amplifier, for receiving the fifth signal;

a third delay means, coupled to said first coupler, for receiving and delaying said fourth signal from said first coupler; and a third coupler coupled between said second coupler and said first delay means and outputting a sixth signal; and said second feedforward cancellation loop comprising:

said second coupler;

said third coupler;

second delay means, coupled to said second coupler, for receiving and delaying said fifth signal from said first amplifier;

a second amplifier, coupled to said third coupler, for receiving said sixth signal from said third coupler and said delayed fourth signal from said first delay means and outputting a seventh signal; and a hybrid circuit, connected between said second delay means and said second amplifier, for receiving and combining said fifth signal and said seventh signal and outputting an eighth signal; and second quadrature hybrid means, coupled between said first and second prelinearizer means, for receiving and combining said eighth signal output from said hybrid circuit in each of said first and second prelinearizer means and outputting a ninth signal having reduced distortion products.

8. A power amplifier according to claim 7, wherein said second coupler comprises and output sample coupler, and wherein said third coupler comprises a fundamental cancellation coupler.

* * * * *